United States Patent [19]

Kataoka

[11] 4,156,203

[45] May 22, 1979

[54] NEGATIVE RESISTANCE ELEMENT CIRCUIT COMBINATIONS

[75] Inventor: Shoei Kataoka, Tanashi, Japan

[73] Assignee: Kogyo Gijutsuin, Japan

[21] Appl. No.: 550,031

[22] Filed: Feb. 14, 1975

Related U.S. Application Data

[60] Division of Ser. No. 273,363, Jul. 20, 1972, which is a division of Ser. No. 167,410, Jul. 29, 1971, Pat. No. 3,691,481, which is a continuation-in-part of Ser. No. 776,292, Aug. 20, 1968, abandoned.

[30] Foreign Application Priority Data

Mar. 21, 1968 [JP] Japan ............................... 43-18010
Apr. 23, 1968 [JP] Japan ............................... 43-26814

[51] Int. Cl.² .............................................. H03F 3/14
[52] U.S. Cl. ........................................... 330/5; 330/53
[58] Field of Search ............................................. 330/5

[56] References Cited

U.S. PATENT DOCUMENTS

| | | | |
|---|---|---|---|
| 3,526,844 | 9/1970 | Bartelink et al. | 330/5 |
| 3,544,914 | 12/1970 | Suga | 330/5 |
| 3,551,831 | 12/1970 | Kino et al. | 330/5 |

Primary Examiner—Rudolph V. Rolinec
Assistant Examiner—Darwin R. Hostetter
Attorney, Agent, or Firm—Robert E. Burns; Emmanuel J. Lobato; Bruce L. Adams

[57] ABSTRACT

Occurrence of high field domain in the conventional Gunn diode is prevented by covering a solid body such as a semiconductor element partially or wholly by a dielectric member or by a control element such as a metallic layer coupled reactively with the solid body through a dielectric member, whereby a solid state element having a negative differential conductivity is obtained. Such a type of negative-resistance solid state element, together with its various modes of embodimental construction disclosed herein, affords a superior solid state element which is applicable to amplifiers, oscillators, and the like of millimeter or submillimeter bands.

5 Claims, 21 Drawing Figures

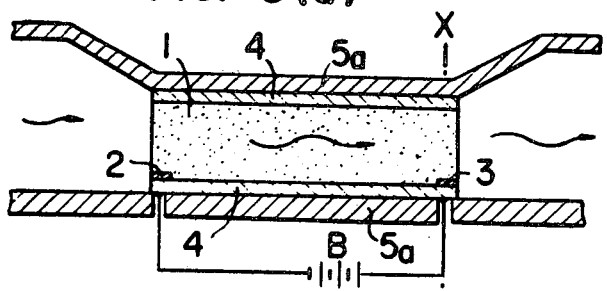
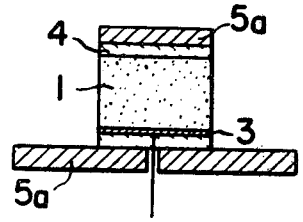
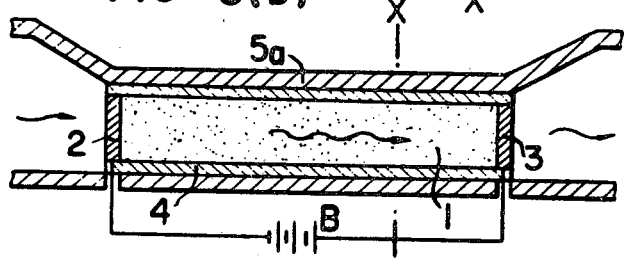
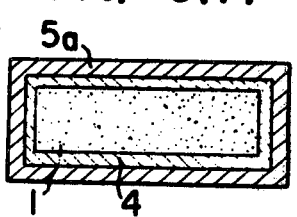
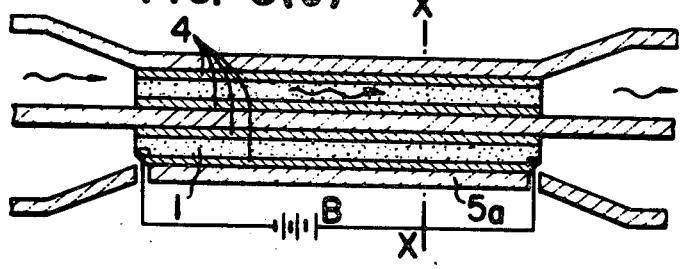
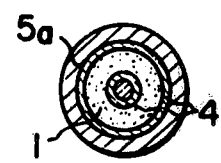
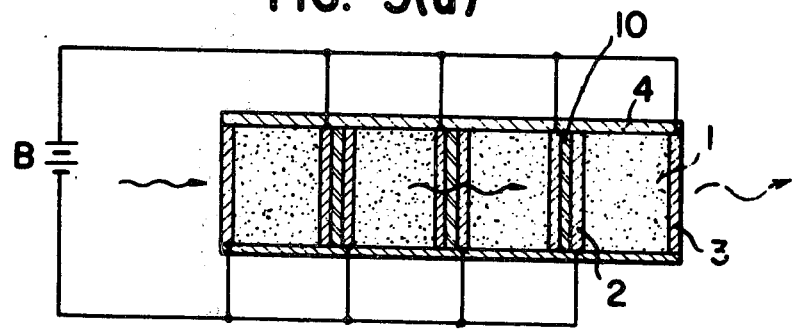
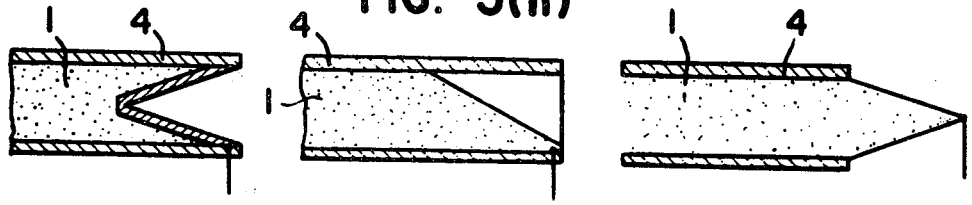

NEGATIVE RESISTANCE ELEMENT CIRCUIT COMBINATIONS

REFERENCE TO RELATED APPLICATION

This application is a division of application Ser. No. 273,363 filed July 20, 1972 which is a division of application Ser. No. 167,410 filed July 29, 1971 and now U.S. Pat. No. 3,691,481 which is a continuation-in-part of application Ser. No. 776,292 filed Aug. 20, 1968 and now abandoned.

BACKGROUND OF THE INVENTION

This invention relates to a novel type of negative-resistance solid state element, and more particularly to such type of element that exhibits negative differential conductivity upon application thereto of a high electric field and to applications thereof.

Heretofore, negative-resistance elements such as the so-called Exaki diode, which utilize a tunnel effect of semiconductors, have been known. However, in the Exaki diode, since the negative resistance is obtained at the P-N junction of the semiconductive substances, the negative differential conductivity is exhibited only for a specific polarity, and because of the capacitance existing at the junction point, the element cannot be used at frequencies higher than 10 GHz. These features together with its limited output power constitute the drawbacks of this type of diode.

The so-called Gunn diode is also known, wherein a semiconductive material such as GaAs which has two valleys in its conduction band is employed. When a high electric field is applied across such an element, electrons are transferred from the lower energy valley to the higher energy valley, and because mobility of the electrons in the higher energy valley is less than the mobility in the lower energy valley, the average speed of electrons decreases with increase in electric field. When the intensity of the internal electric field applied from outside as described above exceeds a critical value (about 3000V/cm), a high field domain is created near the cathode, which is thereafter shifted to the anode by the action of the applied electric field. When the high field domain reaches the anode, it disappears at once, and an impulsive current is caused to flow through the semiconductive substance because of the disappearance of the high field domain. Following this disappearance, new high field domain is created near the cathode and the same sequences mentioned above are repeated at a frequency determined by the length of the element.

This type of solid state element can be utilized in generating high-frequency oscillation of a frequency determined by $1/v_d$, wherein $1$ designates the length of the element, and $v_d$ designates the velocity of the high field domain. Considering the fact that the velocity $v_d$ of the high field domain is about $10^7$ cm/sec., it is apparent from this formula that the length of the element must be minimized to an extremely short value (of the order of several microns) if it is desired to obtain microwave or millimeter wave-length.

Despite various efforts to obtain still higher frequencies than those described above, it has been found that the practical limitation exists around several tens of GHz, and the resultant oscillation output is rapidly decreased with increase in the frequency. Such features together with its excessively narrow frequency band constitute drawbacks of the Gunn type solid element.

The so-called LSA diode is also known. It is believed that with this type of diode further increase in the oscillation frequency can be attained with a moderate efficiency. However, in this case, since the biasing electric field must be higher than twice the value of the Gunn diode, the semiconductive material must be of extremely uniform quality, and, moreover, as there is a limitation in the relationship between the electron density and frequency, these are other features constituting the shortcomings of the LSA diode.

It has been found that, if one or whole part of the surface of a semiconductive element of, for instance, GaAs, is covered by a dielectric layer or a metallic layer which is reactively coupled with the semiconductive element through an intermediate dielectric thin layer, the occurrence of the high field domain at the time when a high electric field is applied thereacross can be prevented, and a phenomenon which might be called "negative-differential resistance characteristic" or "negative differential conductivity" can be obtained. Semiconductors exhibiting this phenomenon are described as exhibiting "negative differential conductivity" or "negative differential mobility" in their drift velocity electric field characteristic.

SUMMARY OF THE INVENTION

With the above-described discovery in view, the principal object of the present invention is to provide a novel type negative-resistance solid state element, whereby the aforedescribed difficulties in conventional elements are substantially reduced or eliminated.

Another object of the present invention is to provide a novel type of solid state element, which is operable under an entirely new principle completely differing from those of the conventional elements, whereby oscillation in a range of from extremely low frequency to 300 GHz can be obtained.

Still another object of the present invention is to provide a novel type of solid state element, which is operable under an entirely new principle and having a completely new configuration, whereby a much improved negative differential conductivity is obtained, and the element is made applicable to a wide variety of applications such as in oscillation and amplification.

The above stated objects and other objects of the present invention can be accomplished by a novel type of negative-resistance solid state element which comprises a semiconductor element which exhibits negative differential conductivity when placed in a high electric field and having at least two end portions; a plurality of electrodes ohmically attached to the semiconductor element at least at two end portions thereof for application of an electric voltage causing production of said high electric field; and a dielectric member, or a thin dielectric member and at least one control element which covers at least one part of the semiconductor element with the control element being reactively coupled with the semiconductor element through the dielectric member, for effectively suppressing the high field domain created in the semiconductor element at the time when a high electric voltage is applied across the electrodes thereby creating a negative-differential conductivity within the bulk of the semiconductor element.

The nature, principle, and advantages of the present invention will become more apparent from the following description and appended claims, when considered in conjunction with the accompanying drawings, wherein the same reference numerals refer to like or corresponding parts throughout the several views.

BRIEF DESCRIPTION OF THE DRAWINGS

FIGS. 5(a), 5(b), 5(c) and 5(d) are different embodiments of an amplifier conductor, to which an embodiment of this invention is applied;

FIGS. 5(e), 5(f) and 5(g) are, respectively, sectional views taken along the line X—X of FIGS. 5(a), 5(b) and 5(c); and FIG. 5(h) shows three different forms of the semiconductor element to be used in the embodiments of FIGS. 5(a) through FIG. 5(d).

DETAILED DESCRIPTION OF PREFERRED EMBODIMENTS

Figure 1A:
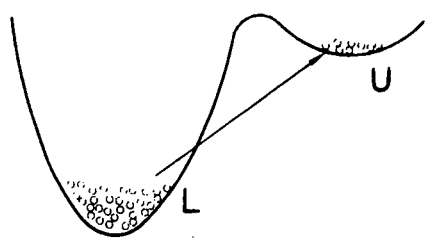
FIGS. 1(a) through 1(e) are explanatory diagrams for explaining the operating principles of the conventional Gunn diode.
Figure 1B:
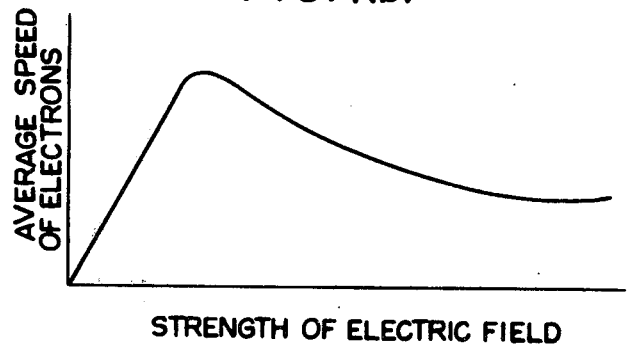
Figure 1C:
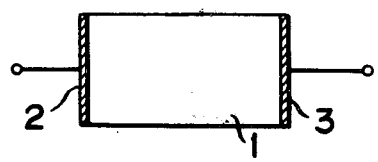
Figure 1D:
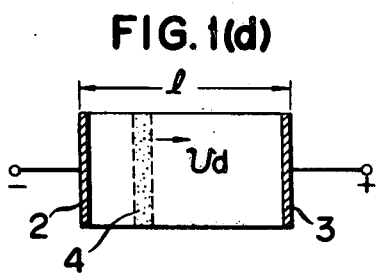

Referring first to FIGS. 1(a) through 1(e) showing explanatory diagrams to be employed for an explanation of the conventional Gunn diode, there is illustrated a semiconductor element such as GaAs which has two valleys in its electron conduction band (see FIG. 1(a)), and because one valley of lower energy has much higher electron mobility than that of the higher energy valley, if such a semiconductor element 1 (see FIG. 1(b)) is provided with two electrodes 2, 3 ohmically connected at both ends, and a d.c. high voltage is applied across the electrodes 2, 3, the average speed of the electrons which were at first in the lower energy valley will gradually increase as graphically shown in FIG. 1(b). However, if the applied voltage exceeds a certain critical value, the electrons will start to be transferred to the higher energy valley, and since the mobility of the electrons therein is much lower than that of the first valley, the average speed of the electrons will decrease as shown in FIG. 1(b).

Figure 1E:
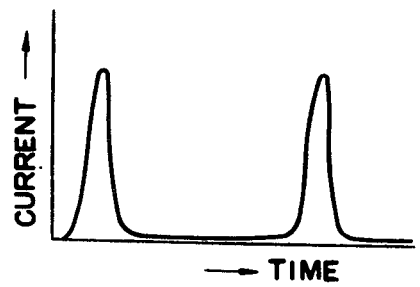

This decrease of the average speed of the electrons should cause negative differential conductivity within the bulk of the semiconductor element but for the creation of a high field domain as described before. The high field domain is in itself a dipole layer of space charges or a region whereacross a high electric field appears. This high field domain is created at first at a position near the cathode 2 when the internal electric field of the semiconductor element 1 exceeds a critical value of approximately 3000v/cm (in GaAs), and the domain is shifted toward anode 3 at a velocity of $v_d$. The creation of the field domain causes a decrease in the electric field in other parts of the semiconductor element than at the high field domain provided that a constant voltage is applied to the semiconductor element and the current flowing through the semiconductor element 1 is decreased as shown in FIG. 1(e).

When the high field domain reaches the anode 3, it disappears at once. The disappearance of the high field domain causes the resistance of the semiconductor element 1 to decrease, and the current flowing therethrough is increased as indicated by the pulse-like peaks in FIG. 1(e). This type of current oscillation is called "Gunn oscillation" and has been used widely in conjunction with a tuning circuit. The Gunn diode, however, does not show a negative resistance characteristic except at a particular frequency determined by the electron transit time.

Figure 2:
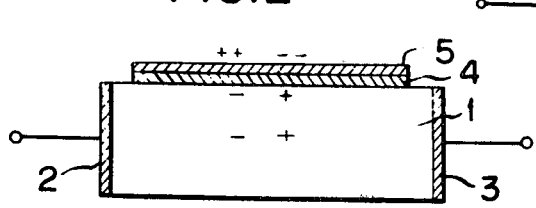
FIG. 2 is an explanatory diagram for explaining the operating principle of the present invention.

Referring now to FIG. 2 which illustrates the principle of operation of one embodiment of this invention, a solid state element comprises a semiconductor element 1 having electrodes 2, 3 attached to both ends thereof, a dielectric member 4, and a metallic layer or control element 5 which is reactively coupled with the semiconductor element 1 through an intermediately interposed thin layer of the dielectric member 4. In this arrangement, when a d.c. high voltage is applied across the electrodes 2 and 3, and if the value exceeds a certain critical value, the formation of high field domains due to the space charges will now be prevented by the existence of both the dielectric member 4 and the metallic layer 5 which act as capacitors, and the negative differential conductivity will be exhibited in the bulk of the semiconductor element 1. Since this feature of the present invention of negative differential conductivity is obtained not in the local junction layer as in the conventional diodes but within the whole or part of the bulk of the semiconductor element 1, a far larger value of the output can be obtained with much improved efficiency, and this possibility opens up various fields of applications in the high-power ultra-high-frequency technique.

Figure 3:
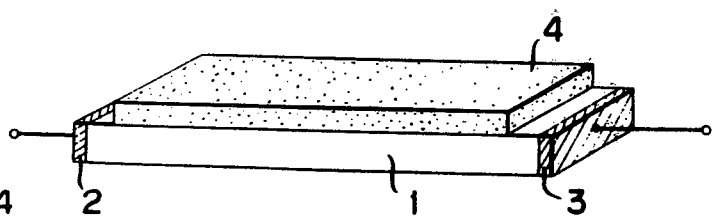
FIG. 3 illustrates one embodiment of a negative-resistance solid state element according to the present invention.

The above-described provision of the metallic layer 5 can be carried out in any of various ways such as providing it only on one side or on both sides of the planar semiconductor element 1. Alternatively, the metallic layer 5 may be omitted totally and a layer of dielectric material of high dielectric constant, for instance, BaTiO$_3$, may be employed at one side or both sides of the semiconductor element 1 as indicated in FIG. 3. In carrying out the invention, the dielectric constant of the dielectric member 4 disposed on the surface of the semiconductor element 1 is higher than that of the semiconductor element itself, for example, from 10,000 to 12,000 in the case of BaTiO$_3$ in comparison with 12.5 in the case of GaAs element, and the electric lines of force due to the aforementioned space charges pass substantially through the dielectric members and do not increase the electric field in the semiconductor element 1 itself, thereby preventing formation of high field domain. In other words, since the dielectric constant of the dielectric member is high, the space charge in the semiconductor element 1 apparently assumes the state of being short-circuited by means of the dielectric members, thus suppressing generation and growth of the space charges, as a result. Consequently, as a matter of fact, any appreciable amount of space charge is not produced. Even if some space charges are produced, these minor space charges do not impart any effective influence to the electric field distribution in the semiconductor element 1, so that when the electric field in the semiconductor element exceeds the critical value thereof, the solid state element exhibits a negative differential conductivity between the electric voltage and current across the electrodes 2 and 3 irrespective of the polarity of the electric voltage applied thereto.

For the purpose of enabling skilled persons in the art to understand and readily reduce this principle in practice, the following actual examples are described.

A planar GaAs semiconductor element was prepared from material of doping density $n_o = 6 \times 10^{13}$ cm$^{-3}$ and mobility of 8,000 cm$^2$/Vs in a dimension of 1 mm long, 250 μm thick, and 500 μm wide. At both ends of the element, Au-Ge metal electrodes were ohmically attached by evaporative deposition. When a d.c. voltage of 320 v was applied to the element across the electrode, the current flowing through the element exhibited frequency of about 100 MHz due to travelling domain-mode current oscillation. When a metal plate was attached to this GaAs element through a sheet of "Myler" as the dielectric material having thickness of 4 μm and relative permittivity of 2.2, no travelling domain-mode current oscillation appeared. Furthermore, the result of measurement of the field distribution in the interior of the element by means of capacitance probing revealed that no high field domain existed, and that a d.c. field was distributed more at the anode side.

In another example, a planar GaAs element of 1 mm long, 2 mm wide, and 100 microns thick was prepared from material of doping density $n_o = 5 \times 10^{13}$ cm$^{-3}$. Metal contacts were placed by vacuum evaporation at an interval of 1 mm between them. To this GaAs element, a sheet of dielectric material of BaTiO$_3$ having a thickness of 500 μm and different relative permittivity of 3,000 and 1,000, and SrTiO$_3$ having relative permittivity of 300 was attached. When a voltage of 320 V was applied to one of the electrodes, and with no dielectric member attached, high field domains were generated due to the Gunn oscillation. However, after attaching the dielectric member of the above specified thickness and permittivity, the Gunn oscillation was perfectly suppressed.

Figure 4A:
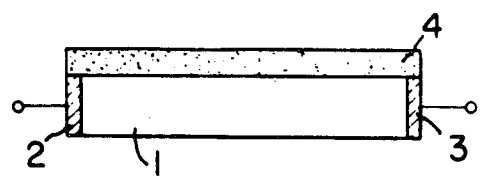
FIG. 4(a) illustrates another embodiment of the present invention.

It has been experimentally found that in the embodiments as illustrated in FIGS. 2 and 3, if the dielectric member 4 or the metallic layer 5 and dielectric member 4 are not extended so as to cover the ohmic electrodes also, the effect of suppressing generation of the high field domain is relatively low, so that it is required to cover the semiconductor element 1 with the dielectric member or the metallic layer up to the region longer than the portions having the negative differential conductivity, as shown in FIG. 4(a). According to the structure as illustrated in FIG. 4(a), since the dielectric member 4 covers the junction portions between the metal electrodes and the semiconductor element 1, effective suppression of the space charges at the regions near the electrodes can be attained without adopting a complicated structure.

Figure 4B:
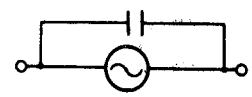
FIG. 4(b) is circuit equivalent of the construction of FIG. 4(a)
Figure 4C:
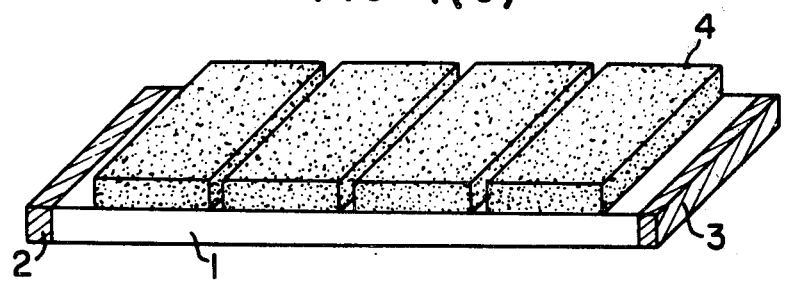
FIGS. 4(c), 4(d), and 4(e) are different modifications of the embodiment of FIG. 4(a)
Figure 4D:
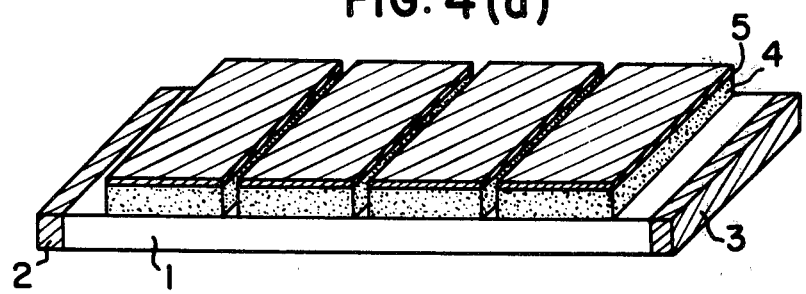
Figure 4E:
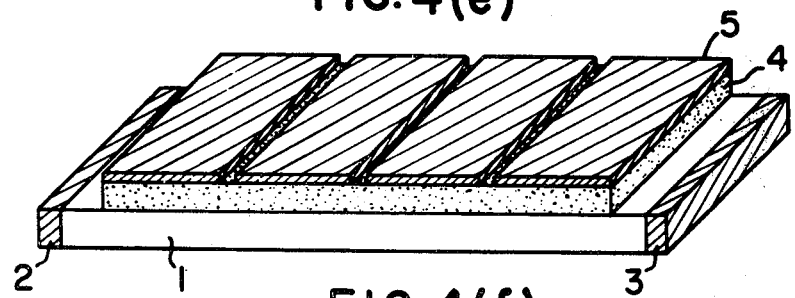
Figure 4F:
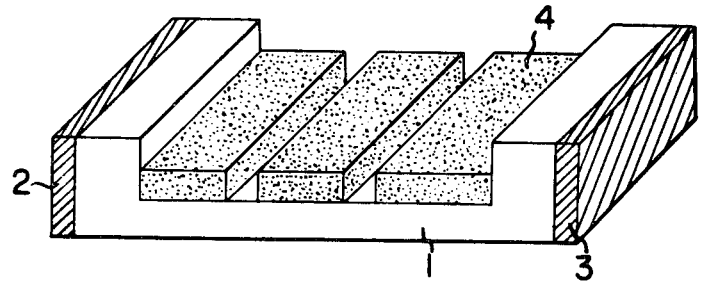
FIG. 4(f) is a still further embodiment of this invention in which air gaps, as shown in FIGS. 4(c) and 4(d), are provided.

In this case, however, since the dielectric member covers the ohmic electrode portions or the inactive region of the semiconductor, the micro-wave power which has been oscillated or amplified is short-circuited, as clearly understood from the circuit of FIG. 4(b) which is an equivalent circuit of the element of FIG. 4(a), whereby the efficiency of the solid state element is remarkably decreased. Such a disadvantage as described above can be effectively eliminated by providing air gaps on the dielectric member 1 or on the metal layer 5 in the direction perpendicular to the direction of the applied d.c. electric field, as shown in FIGS. 4(c) and 4(d). In the case of the solid state element of FIG. 4(e), only the metal layer 5 has air gaps and none are provided in the dielectric member 1. According to the structures shown in FIGS. 4(c) and 4(d), leakage loss of any micro-wave power is effectively suppressed, whereby very efficient oscillation or amplification of any micro-wave energy can be carried out. Of course, air gaps as described above may be provided in a different embodiment of this invention, for example, where the central portion of the semiconductor body 1 is indented or hollowed out as shown in FIG. 4(f).

In FIG. 5(a), a strip line forming a transmission line to which a solid state element of this invention is applied is illustrated, in which a solid state element comprising a semiconductor element 1 having a negative-resistance characteristic, dielectric layers 4 attached to both surfaces of the semiconductor element, and electrodes 2 and 3 attached to end portions of the semiconductor element is arranged between two metallic conductors 5a. The electrodes 2, 3 are connected as shown to a d.c. voltage B. The metallic conductors 5a diverge outwardly with respect to each other at each end of the semiconductor element 1 to form suitable input and output means for injecting and extracting signals, such as an AC electric wave signal, into and out of the semiconductor element. According to the structure of the strip line of FIG. 5(a), the space charges or high field domain produced in the semiconductor element 1 is suppressed by the dielectric layers and metallic conductors surrounding the semiconductor element so that the semiconductor element becomes stable and exhibits "negative differential conductivity." In general, if an electric wave is introduced into an ordinary semiconductor element having a positive-resistance characteristic, the electric wave progressively attenuates as it enters into and propagates through the semiconductor element. But, when the conductivity of the semiconductor element is negative with respect to any microwave, the electric wave is amplified as it propagates through the semiconductor element. Accordingly, if a signal wave is introduced towards the negative electrode 2 (left side in the drawing) of one semiconductor element of the strip line as shown by arrows in FIG. 5(a), the signal wave is amplified in the semiconductor element and reaches the positive electrode 3 in an amplified state. As well known in the art, during use of the strip line, the metallic conductors 5a are connected to circuit ground thereby shunting RF fields to ground. In this embodiment, it is necessary to reduce the space interval between the metallic conductors covering the semiconductor element so as to establish impedance matching of the line. Furthermore, for the purpose of decreasing wave reflection at the junction portions between the semiconductor element and air, the end portion of the semiconductor element may be formed as shown in FIG. 5(h).

The embodiment of FIG. 5(a) can be modified, as shown in FIGS. 5(b), 5(c) and 5(d). According to the constructions shown in FIGS. 5(a), 5(b) and 5(c), the amplification factor is in proportion to the length and electron density of the semiconductor element. However, the strength of the d.c. field necessary for creating the above-mentioned large amplification becomes very high, so that the d.c. voltage applied to the electrodes should be made high and this creates problems relating to insulation and power source. Such disadvantages can be eliminated by adopting the construction such as illustrated in FIG. 5(d), in which a plurality of solid state elements each comprising a semiconductor element 1, electrodes 2 and 3 attached to ends of the element 1 and dielectric layers 4 adhered onto the surfaces of the element 1 are arranged in series in the wave-propagation direction through interposed transparent layers 10 (for instance, Teflon) and wherein all the electrodes are connected in parallel to a d.c. voltage. According to the construction of FIG. 5(d), the necessary d.c. voltage becomes low and treatment thereof becomes easy.

According to the embodiments such as illustrated in FIGS. 5(a), 5(b), 5(c) and 5(d), the amplification of any electric wave up to very high frequency can be made easy and their operating life is almost permanent so that their stabilities and reliabilities are very high, thus rendering great contribution to various fields such as electric communication and electronic industries.

What I claim is:

1. An amplifier line comprising, in combination: at least one metal conductor forming a transmission line; and a solid state element disposed inside said metal conductor, said solid state element comprising a semiconductor element exhibiting a negative differential conduction in a high electric field, a dielectric layer covering said semiconductor element, and ohmic electrodes attached in spaced apart relationship to said semiconductor element.

2. An amplifier device comprising: a plurality of a solid state elements arranged in series along the propagation direction of an electric wave; each of said elements comprising a semiconductor body having two ends and exhibiting a negative differenetial conduction in a high electric field, a dielectric layer covering said semiconductor body, and electrodes attached respectively to said ends of said semiconductor element; a d.c. voltage source; and means connecting the electrodes of all said solid state elements in parallel to said d.c. voltage source.

3. In a signal translating device, a semiconductor body which exhibits a region of negative differential mobility in its drift-velocity electric field characteristic in response to a biasing electric field between first and second spaced apart electrical contacts on said body, means for injecting an AC signal into said semiconductor body at the negative end of said field, means for extracting an AC signal from said semiconductor body at the positive end of said field, and means for inhibiting oscillation in said device between said signal injecting means and said signal extracting means, whereby said AC signal injected is amplified between said signal injecting means and said signal extracting means, said means for inhibiting oscillation comprising a metal layer disposed between said means for injecting an A.C. signal into said semiconductor body at the negative end of said field and said means for extracting an A.C. signal from said semiconductor body at the positive end of said field, but not in ohmic contact with said body, and means connecting said metal layer to circuit ground for shunting RF fields to ground, thereby lowering gain per unit length of said body between said injecting means and said extracting means.

4. In a signal translating device, a semiconductor body which exhibits a region of negative differential mobility in its drift-velocity electric field characteristic in response to a biasing electric field between first and second spaced apart electrical contacts on said body, means for injecting an AC signal into said semiconductor body at the negative end of said field, means for extracting an AC signal from said semiconductor body at the positive end of said field, and means for inhibiting oscillation in said device between said signal injecting means and said signal extracting means, whereby said AC signal injected is amplified between said signal injecting means and said signal extracting means, said means for inhibiting oscillation comprising a metal layer disposed between said means for injecting an A.C. signal into said semiconductor body at the negative end of said field and said means for extracting an A.C. signal from said semiconductor body at the positive end of said field, but not in ohmic contact with said body, thereby lowering gain per unit length of said body between said injecting means and said extracting means.

5. An amplifier device comprising, in combination: a solid body composed of semiconductor material having at least two ends and exhibiting a negative differential conductivity characteristic when placed in a high electric field; an electrode ohmically attached to each of said ends; means for applying a bias voltage across said electrodes to produce a high electric field to cause said solid body to exhibit a negative differential conductivity; a dielectric member covering at least one part of said body and being effective to suppress high field domains in said body; means for supplying an input signal to be amplified to said solid body at the negative side thereof; and means for extracting an output signal comprising an amplified version of said input signal from said solid body at the positive side thereof.

* * * * *